United States Patent
Davis et al.

(10) Patent No.: US 8,586,429 B2
(45) Date of Patent: Nov. 19, 2013

(54) METHODS OF FORMING AN ARRAY OF MEMORY CELLS, METHODS OF FORMING A PLURALITY OF FIELD EFFECT TRANSISTORS, METHODS OF FORMING SOURCE/DRAIN REGIONS AND ISOLATION TRENCHES, AND METHODS OF FORMING A SERIES OF SPACED TRENCHES INTO A SUBSTRATE

(75) Inventors: Neal L. Davis, Boise, ID (US); Richard T. Housley, Boise, ID (US); Ranjan Khurana, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/611,517

(22) Filed: Sep. 12, 2012

(65) Prior Publication Data

US 2013/0005115 A1    Jan. 3, 2013

Related U.S. Application Data

(62) Division of application No. 13/248,791, filed on Sep. 29, 2011, now Pat. No. 8,389,353, which is a division of application No. 12/720,322, filed on Mar. 9, 2010, now Pat. No. 8,039,340.

(51) Int. Cl.
*H01L 21/8238* (2006.01)

(52) U.S. Cl.
USPC ............... 438/221; 438/296; 257/E21.548

(58) Field of Classification Search
USPC ............ 438/184, 192, 196, 359; 257/E21.4, 257/E21.483, E21.486, E21.487, E21.488
See application file for complete search history.

(56) References Cited

U.S. PATENT DOCUMENTS

| 5,814,547 | A | 9/1998 | Chang |
| 7,189,628 | B1 | 3/2007 | Mirbedini et al. |
| 7,282,401 | B2 | 10/2007 | Juengling |
| 7,411,268 | B2 | 8/2008 | Karpov et al. |
| 7,915,116 | B2 | 3/2011 | Eppich |

(Continued)

FOREIGN PATENT DOCUMENTS

KR    20100111798    10/2010

OTHER PUBLICATIONS

WO PCT/US2011/024334, Oct. 24, 2011, Search Report/Written Opinon.
WO PCT/US2011/024334, Sep. 11, 2012, IPRP.

*Primary Examiner* — Cheung Lee
(74) *Attorney, Agent, or Firm* — Wells St. John, P.S.

(57) ABSTRACT

A method of forming a series of spaced trenches into a substrate includes forming a plurality of spaced lines over a substrate. Anisotropically etched sidewall spacers are formed on opposing sides of the spaced lines. Individual of the lines have greater maximum width than minimum width of space between immediately adjacent of the spacers between immediately adjacent of the lines. The spaced lines are removed to form a series of alternating first and second mask openings between the spacers. The first mask openings are located where the spaced lines were located and are wider than the second mask openings. Alternating first and second trenches are simultaneously etched into the substrate through the alternating first and second mask openings, respectively, to form the first trenches to be wider and deeper within the substrate than are the second trenches. Other implementations and embodiments are disclosed.

13 Claims, 14 Drawing Sheets

(56) References Cited

U.S. PATENT DOCUMENTS

| | | |
|---|---|---|
| 2002/0004290 A1 | 1/2002 | Gruening et al. |
| 2006/0046407 A1 | 3/2006 | Juengling |
| 2007/0054464 A1 | 3/2007 | Zhang |
| 2007/0117314 A1 | 5/2007 | Ozawa |
| 2007/0141783 A1 | 6/2007 | Peake |
| 2008/0113483 A1 | 5/2008 | Wells |
| 2008/0166856 A1 | 7/2008 | Parekh et al. |
| 2008/0713920 | 7/2008 | Juengling |
| 2009/0035665 A1 | 2/2009 | Tran |
| 2009/0080229 A1 | 3/2009 | Chandra Sekar et al. |
| 2009/0170318 A1 | 7/2009 | Choi |
| 2009/0206443 A1 | 8/2009 | Juengling |
| 2010/0144150 A1 | 6/2010 | Sills et al. |
| 2010/0173470 A1 | 7/2010 | Lee et al. |
| 2010/0248153 A1 | 9/2010 | Lee et al. |
| 2010/0285646 A1 | 11/2010 | Lin et al. |

METHODS OF FORMING AN ARRAY OF MEMORY CELLS, METHODS OF FORMING A PLURALITY OF FIELD EFFECT TRANSISTORS, METHODS OF FORMING SOURCE/DRAIN REGIONS AND ISOLATION TRENCHES, AND METHODS OF FORMING A SERIES OF SPACED TRENCHES INTO A SUBSTRATE

RELATED PATENT DATA

This patent resulted from a divisional application of U.S. patent application Ser. No. 13/248,791, filed Sep. 29, 2011, entitled "Methods Of Forming An Array Of Memory Cells, Methods Of Forming A Plurality Of Field Effect Transistors, Methods Of Forming Source/Drain Regions And Isolation Trenches, And Methods Of Forming A Series Of Spaced Trenches Into A Substrate", naming Neal L. Davis, Richard Housley, and Ranjan Khurana as inventors, which is a divisional application of U.S. patent application Ser. No. 12/720,322, filed Mar. 9, 2010, entitled "Methods Of Forming An Array Of Memory Cells, Methods Of Forming A Plurality Of Field Effect Transistors, Methods Of Forming Source/Drain Regions And Isolation Trenches, And Methods Of Forming A Series Of Spaced Trenches Into A Substrate", naming Neal L. Davis, Richard Housley, and Ranjan Khurana as inventors, the disclosures of which are incorporated by reference.

TECHNICAL FIELD

Embodiments disclosed herein pertain to methods of forming an array of memory cells, to methods of forming a plurality of field effect transistors, to methods of forming source/drain regions and isolation trenches, and to methods of forming a series of spaced trenches into a substrate.

BACKGROUND

Integrated circuitry may be fabricated over and within semiconductive substrates. Individual device components of the circuitry may be separated or electrically isolated from other device components by dielectric or other isolation formed over and/or within the semiconductive substrate. One form of isolation is commonly referred to as trench isolation, wherein trenches are etched into semiconductive substrate material and subsequently filled with one or more dielectric materials.

Integrated circuitry can be fabricated to have many functions, and may include many different electronic devices such as capacitors, transistors, resistors, diodes, etc. One type of circuitry is memory circuitry comprising an array of individual memory cells. In some memory circuitry, individual memory cells include a field effect transistor and a charge storage device, for example a capacitor.

In the fabrication of integrated circuitry, multiple different masking and deposition steps are used. Processing which enables reduction of deposition steps and/or masking steps may be favored over processes requiring greater deposition steps and/or masking steps.

DETAILED DESCRIPTION OF EXAMPLE EMBODIMENTS

An example embodiment of a method of forming an array of memory cells is described initially with reference to FIGS. 1-11. In one embodiment, individual memory cells of the array include a field effect transistor and a charge storage device. Regardless, an embodiment of the invention also includes a method of forming a plurality of field effect transistors.

Figure 1:
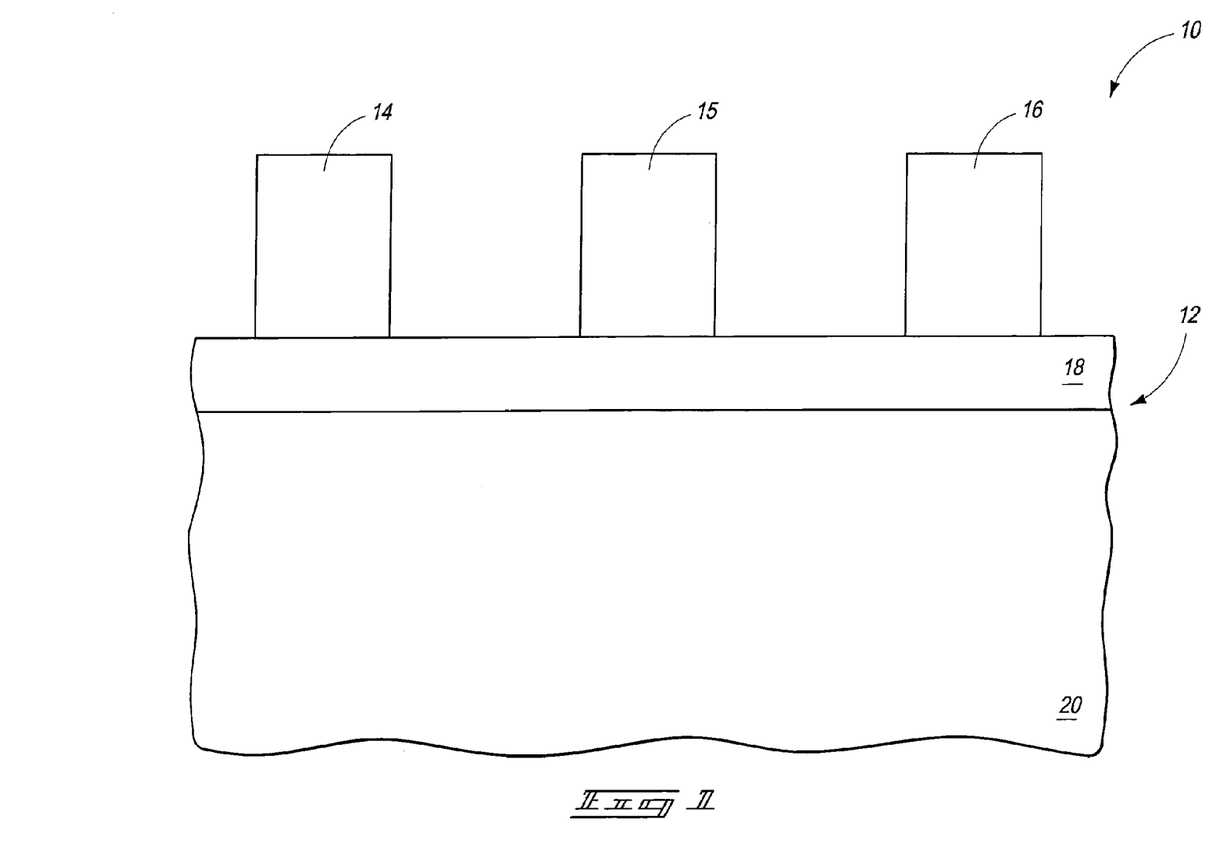
FIG. 1 is a diagrammatic sectional view of a substrate fragment in process in accordance with an embodiment of the invention.

Referring to FIG. 1, a substrate fragment is indicated generally with reference numeral 10. In one embodiment, such comprises a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Semiconductor substrate 10 may be homogenous or non-homogenous, for example comprising multiple different composition regions and/or layers. Substrate 10 comprises semiconductive material 12 having a plurality of spaced lines 14, 15, 16 formed thereover. Example semiconductive materials 12 include monocrystalline or polycrystalline silicon, gallium arsenide, indium phosphide, or any other existing of yet-to-be developed material possessing semiconductor properties. Semiconductor substrate 10 may include non-semiconductive materials such as insulative and conductive materials and may, by way of example, comprise a semiconductor-on-insulator substrate. In the depicted example, semiconductive material 12 has an upper-doped region 18 and a lower-doped region 20. Lower-doped region 20 will function as channel regions in field effect transistors, and upper region 18 will function as source/drain regions. Additional regions or layers may be provided, and regions 18 and 20 may be formed later in the processing.

Spaced lines 14, 15, 16 may be homogenous or non-homogenous, for example having multiple different composition regions and/or layers. In example embodiments, spaced lines 14, 15, 16 may comprise, consist essentially of, or consist of photoresist. Lines 14, 15, 16 may comprise one or more hard-mask materials. Further, one or more layers of material other than semiconductive material may be provided as part of substrate 10 between region 18 and spaced lines 14, 15, 16. Examples include one or more hard-mask layers and/or anti-reflective coatings such as DARC (silicon-rich silicon oxynitride) and/or BARC (a spin-on organic film). In one embodiment, the plurality of spaced lines are formed as an array of parallel lines having a nominal width of 55 nanometers and space there-between of 78 nanometers in the depicted cross-section. Alternately, width of lines 14, 15, 16, and/or spaces there-between, may be different with respect to one another. In other words, all the line widths and all the space widths need not be equal.

Figure 2:
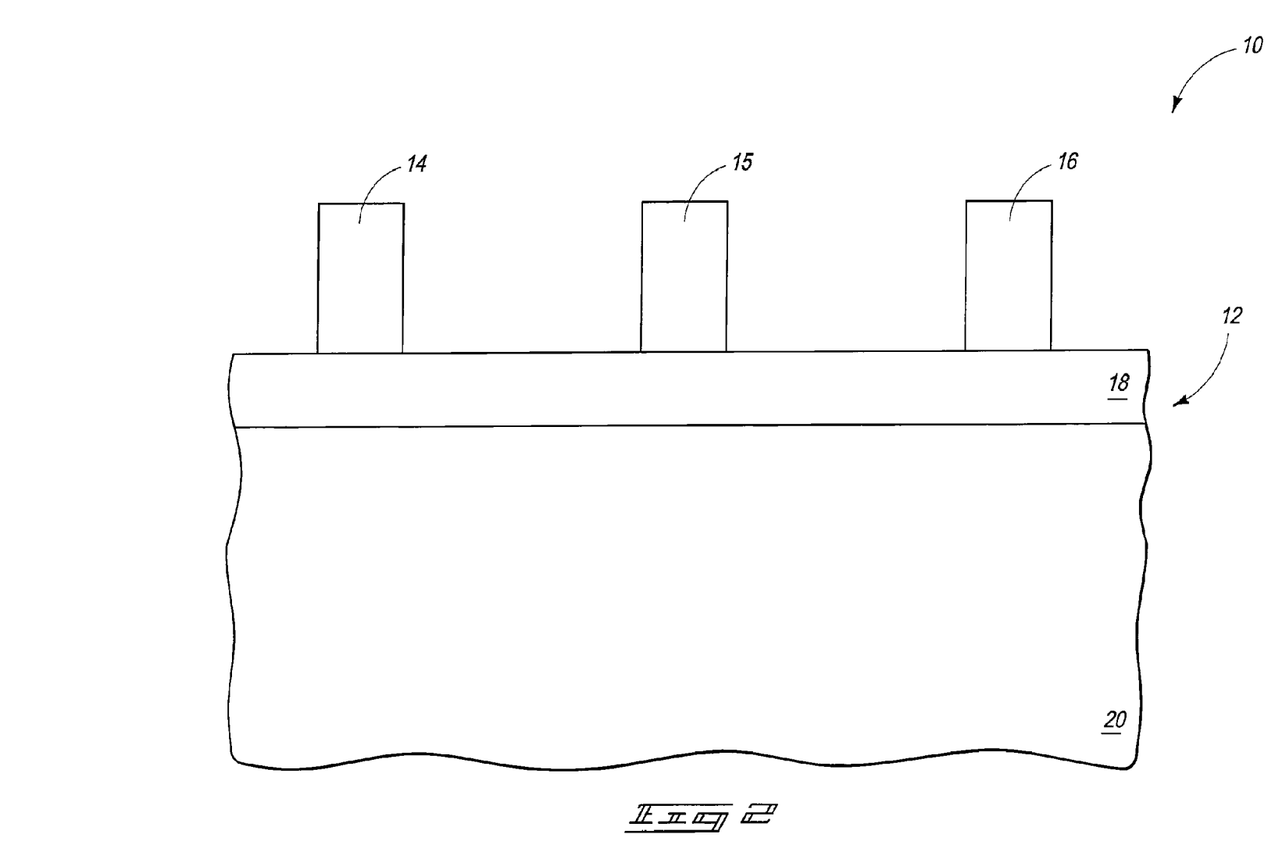
FIG. 2 is a view of the FIG. 1 substrate at a processing step subsequent to that shown by FIG. 1.

Referring to FIG. 2, spaced lines 14, 15, 16 have been laterally trimmed to reduce their respective widths. Such may be conducted by an isotropic etch which removes material approximately equally from the sides and tops of the spaced lines. Alternately, chemistries and conditions may be used which tend to etch greater material from the lateral sides than from the respective tops. Alternately, chemistries and conditions may be used which tend to etch greater material from the tops than from the lateral sides. Further, no lateral trimming need occur. Feature widths and spacings in FIG. 1 may or may not be sub-lithographic, and the line widths and spaces in FIG. 2 may or may not be sub-lithographic. In one embodiment, approximately 10 nanometers are laterally trimmed from each sidewall of each line 14, 15, 16, thereby providing a line width of 35 nanometers with space between adjacent lines being about 98 nanometers. For purposes of the continuing discussion, lines 14, 15, and 16 may be considered as having respective maximum widths which may be the same or different relative one another, with 35 nanometers being but one example. In one example, lines 14, 15, 16 of FIG. 1 may be considered as precursor lines individually having maximum width greater than lines 14, 15, 16 of FIG. 2. Further, in one embodiment where lateral trimming is used, the etching of the FIG. 1 lines to produce those of FIG. 2 may occur to result in the desired maximum widths without subsequent processing. Alternately, by way of example, the lines might be trimmed to be less than a desired maximum width, and subsequently processed to increase their widths to desired maximum widths.

Figure 3:
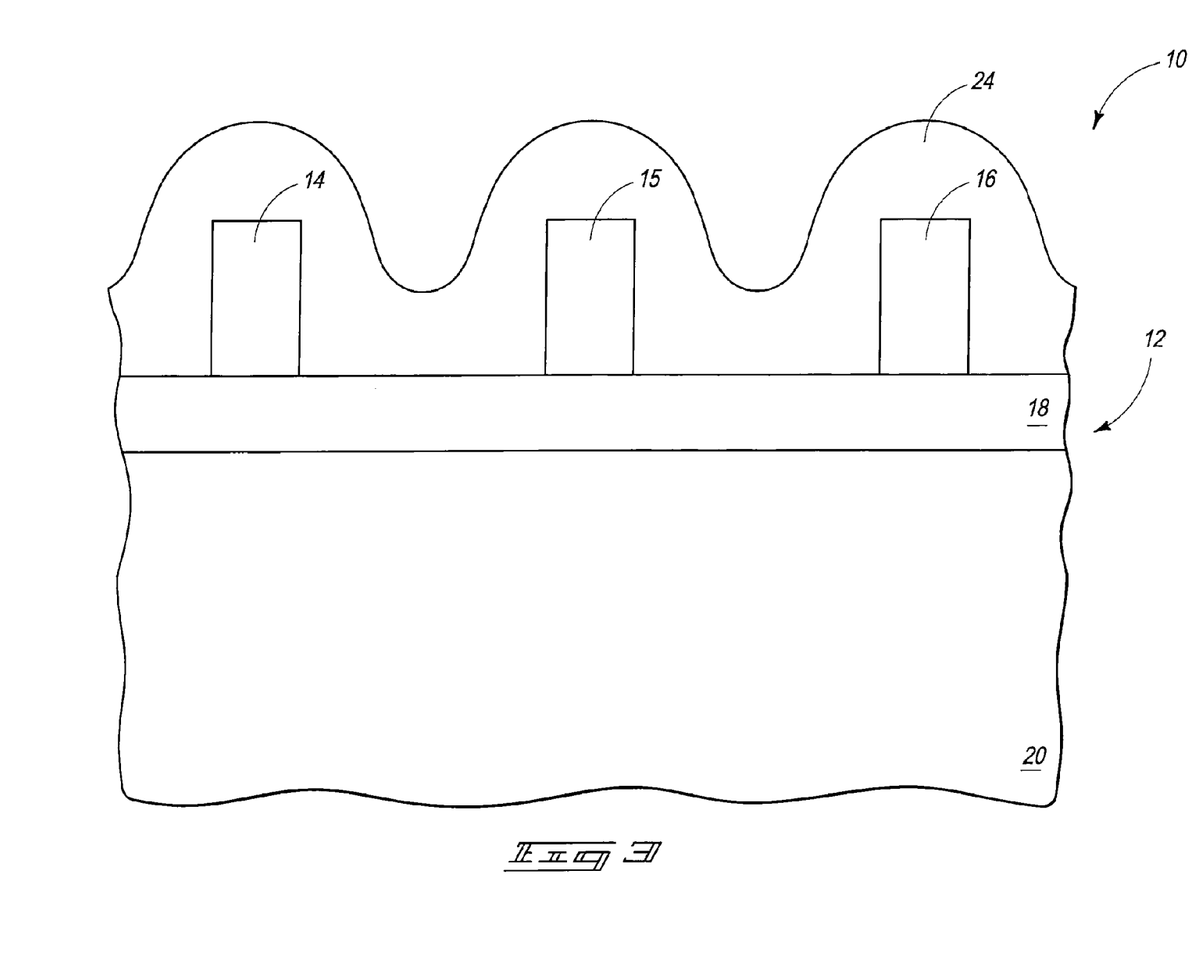
FIG. 3 is a view of the FIG. 2 substrate at a processing step subsequent to that shown by FIG. 2.

Referring to FIG. 3, a spacer-forming layer 24 has been formed over the substrate. Such may be homogenous or non-homogenous, and may comprise any of conductive, insulative and semiconductive materials, including any combinations thereof. Examples include silicon dioxide, silicon nitride, polysilicon, and conductive metal nitrides.

Figure 4:
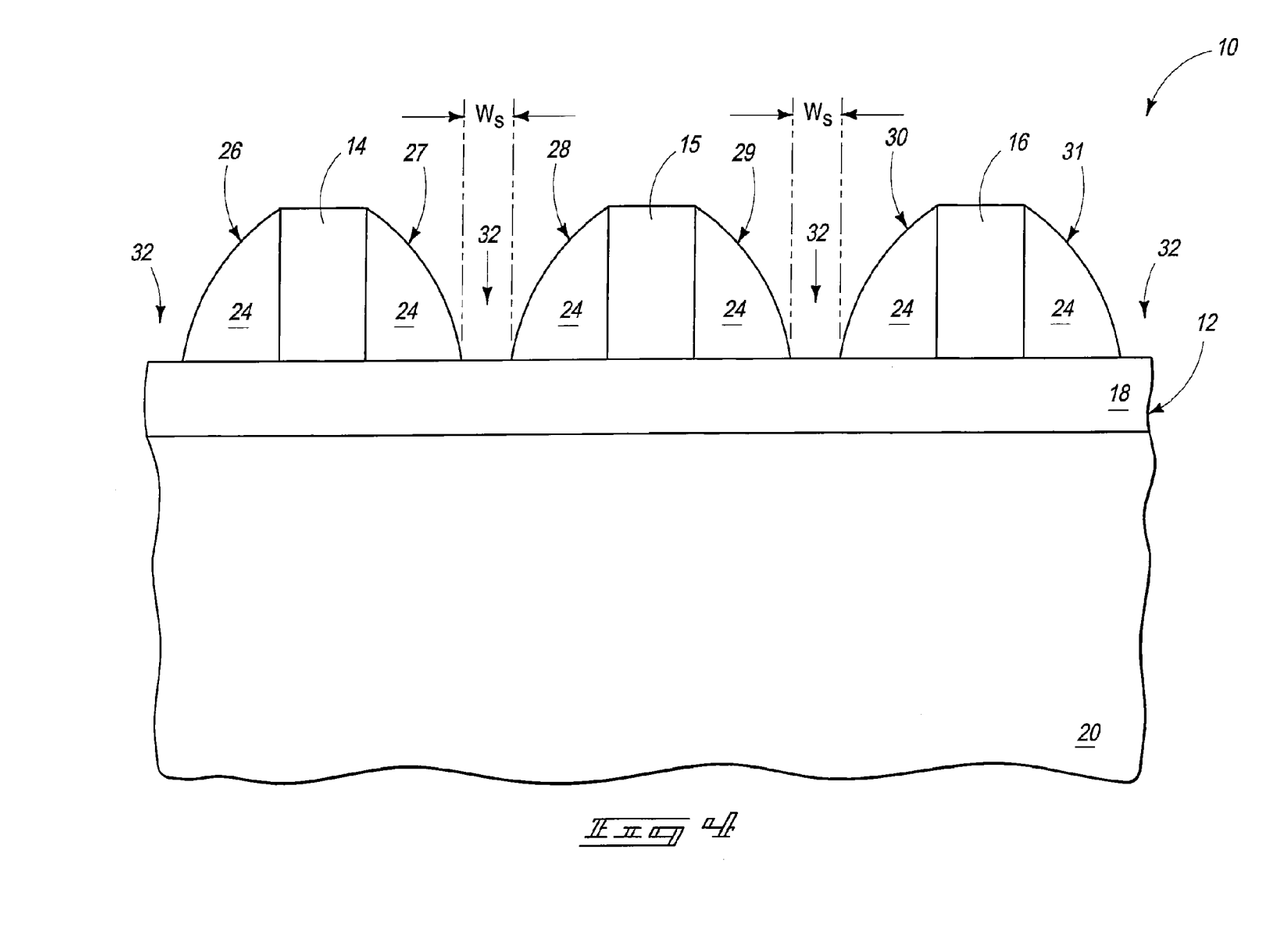
FIG. 4 is a view of the FIG. 3 substrate at a processing step subsequent to that shown by FIG. 3.

Referring to FIG. 4, spacer-forming layer 24 has been anisotropically etched to form sidewall spacers 26, 27, 28, 29, 30 and 31 on opposing sides of the spaced lines. Such leaves spaces 32 between immediately adjacent of the lines. Spaces 32 may be considered as having a respective minimum width $W_s$ between immediately adjacent of the spacers. Minimum width $W_s$ may be the same or different for different spaces 32. Regardless, in one embodiment, individual of lines 14, 15 and 16 have greater maximum width than minimum width of spaces 32. In the above specific example where lines 14, 15, 16 in FIG. 2 have a maximum width of 35 nanometers, with space between immediately adjacent lines of 98 nanometers, an example minimum width $W_s$ is about 20 nanometers, with the respective spacers having a maximum width of about 39 nanometers. Such may be achieved, for example, by deposition of layer 24 to a thickness of about 39 nanometers. Layer 24 may be partially masked during the etch to form spacers 26-31, or may be totally unmasked.

Figure 5:
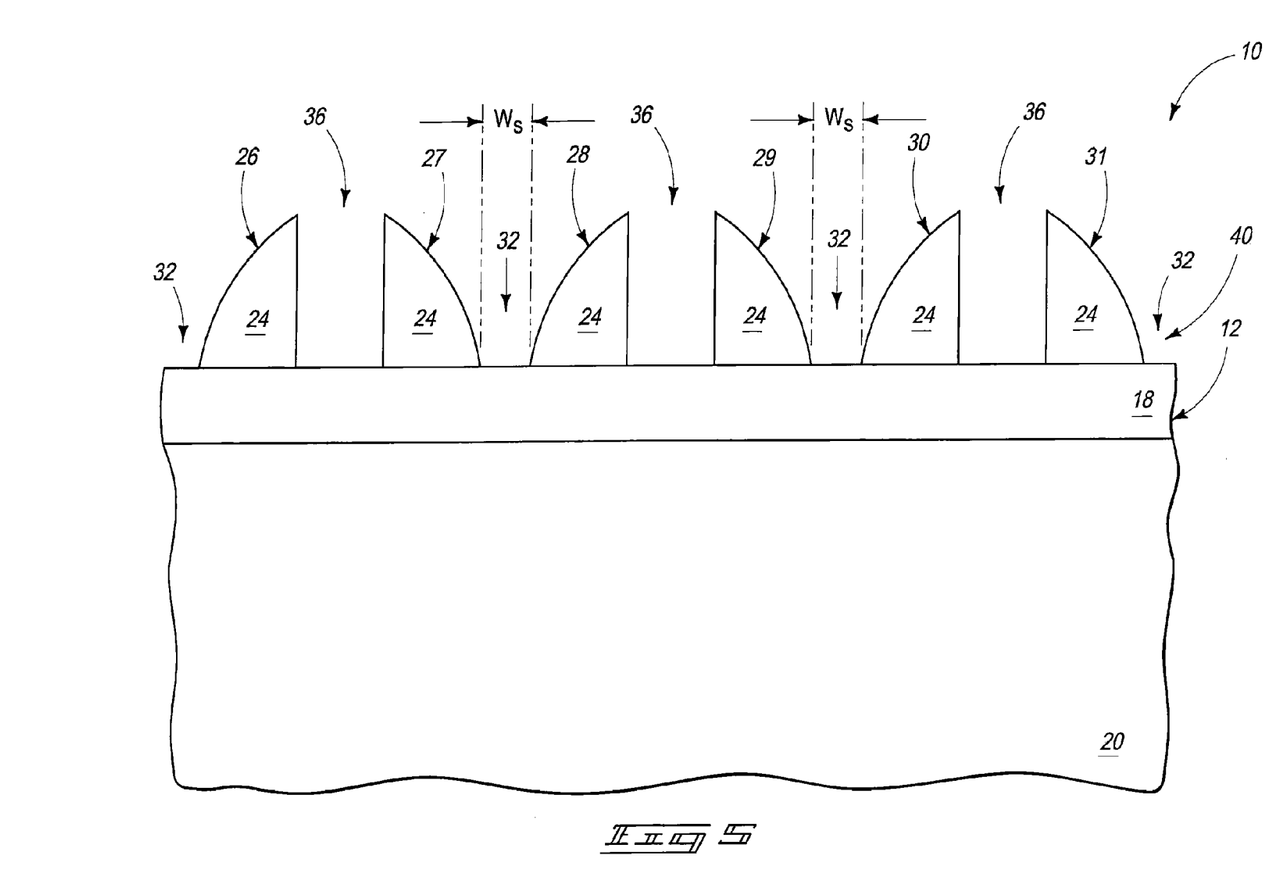
FIG. 5 is a view of the FIG. 4 substrate at a processing step subsequent to that shown by FIG. 4.

Referring to FIG. 5, spaced lines 14, 15, 16 (not shown) have been removed from between spacers 26-31 to form alternating first and second mask openings 36, 32, respectively, between spacers 26-31. Thus, a mask 40 is created which will be used for etching substrate material 12 therebeneath. First mask openings 36 are located where the spaced lines were previously located, and are wider than second mask openings 32. First mask openings 36 may or may not have the same maximum width. Further, second mask openings 32 may or may not have the same maximum width. In one embodiment, maximum widths of all first mask openings 36 within the array are the same, and width of all second mask openings 32 within the array are the same and less than that of the first mask openings.

The above describes but one technique of forming alternating first and second mask openings in a mask which is received over semiconductive material of a semiconductor substrate, wherein the first mask openings are wider than the second mask openings. Any alternate existing or yet-to-be developed technique might be used. Regardless, in one embodiment, first mask openings 36 are at least 1.5 times wider than second mask openings 32, and in one embodiment, at least 1.75 times wider than second mask openings 32.

Figure 6:
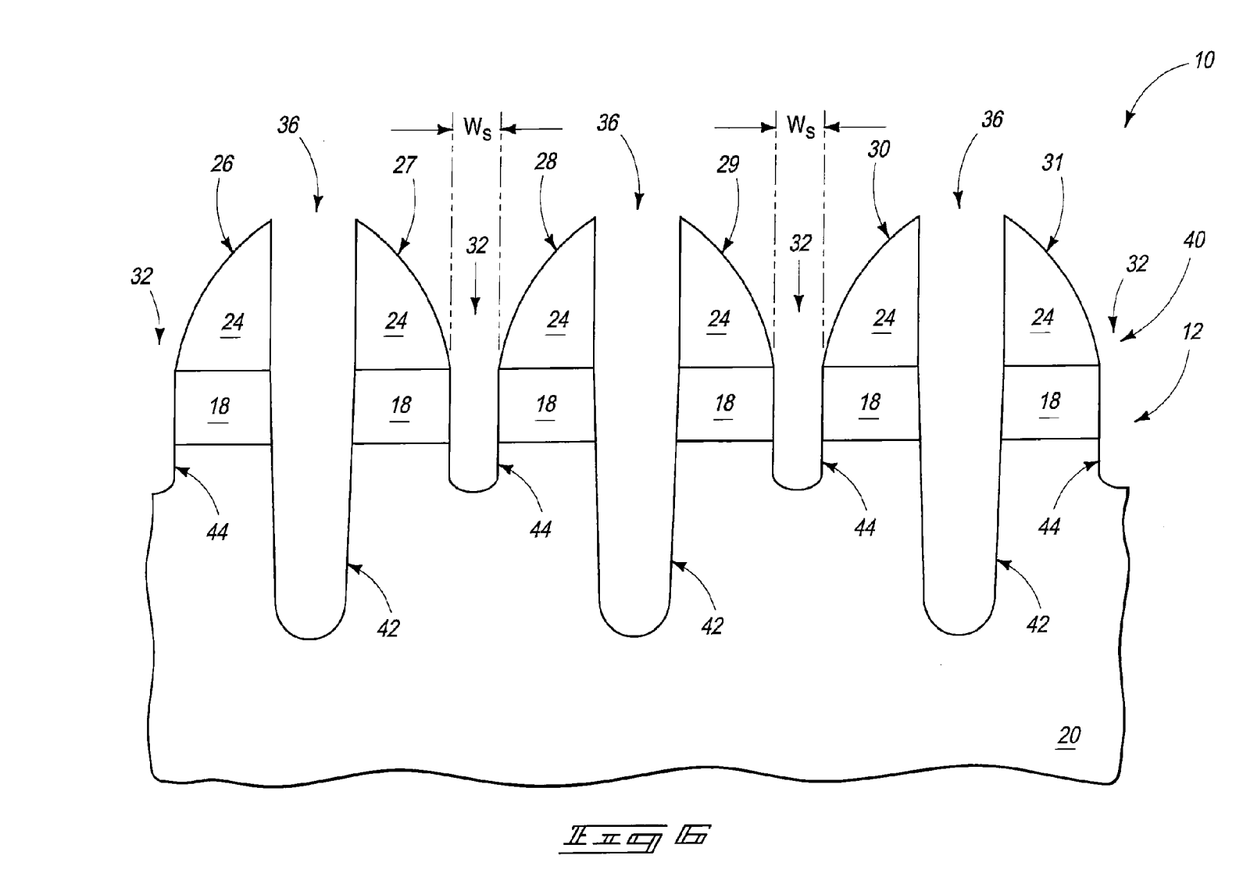
FIG. 6 is a view of the FIG. 5 substrate at a processing step subsequent to that shown by FIG. 5.

Referring to FIG. 6, first mask openings 36 have been used to etch inter-transistor (between transistors) trenches 42 into semiconductive material 12 and second mask openings 32 have been used to etch intra-transistor (within at least one single transistor) trenches 44 into semiconductive material 12. Inter-transistor trenches 42 are etched wider and deeper within semiconductive material 12 than are intra-transistor trenches 44. In one embodiment, inter-transistor trenches 42 are about twice as deep within semiconductive material 12 than are intra-transistor trenches 44. By way of example only, an example inter-transistor trench depth within the semiconductive material is 250 nanometers while an example intra-transistor trench depth within the semiconductive material is 125 nanometers. Accordingly, the same mask 40 is used for etching the depicted shallower and deeper trenches. In one embodiment, such etching occurs without additional masking over the array such that the depicted etching of inter-transistor trenches 42 and intra-transistor trenches 44 may occur simultaneously.

The depicted different trench depths of inter-transistor trenches 42 in comparison to intra-transistor trenches 44 may be obtained in conducting a single etch by taking advantage of the different maximum open widths of first mask openings 36 in comparison to that of second mask openings 32. Using wider mask openings may result in deeper etching within substrate material in comparison to use of narrower mask openings, and for example where the etching comprises plasma enhanced etching. For example, where semiconductive material 12 consists essentially of doped monocrystalline silicon, an example etching technique that will produce trenches 42 to be approximately twice as deep as trenches 44 includes using an inductively coupled plasma etching reactor with HBr at a flow rate from about 100 sccm to 300 sccm, $O_2$ at a flow rate from about 100 sccm to about 300 sccm, substrate temperature from about 40° C. to 90° C., chamber pressure from about 10 mTorr to 60 mTorr, power at about 200 W to 500 W, and electrode voltage at about 200V to 400V.

One or both of inter-transistor trenches 42 and intra-transistor trenches 44 may be filled with one or more dielectric materials. Further, when dielectric material is provided in both, such may be filled with the same or different dielectric material(s). Additionally or alternately by way of example only, some or all of either of inter-transistor trenches 42 and intra-transistor trenches 44 may comprise void-space in a finished circuitry construction.

Figure 7:
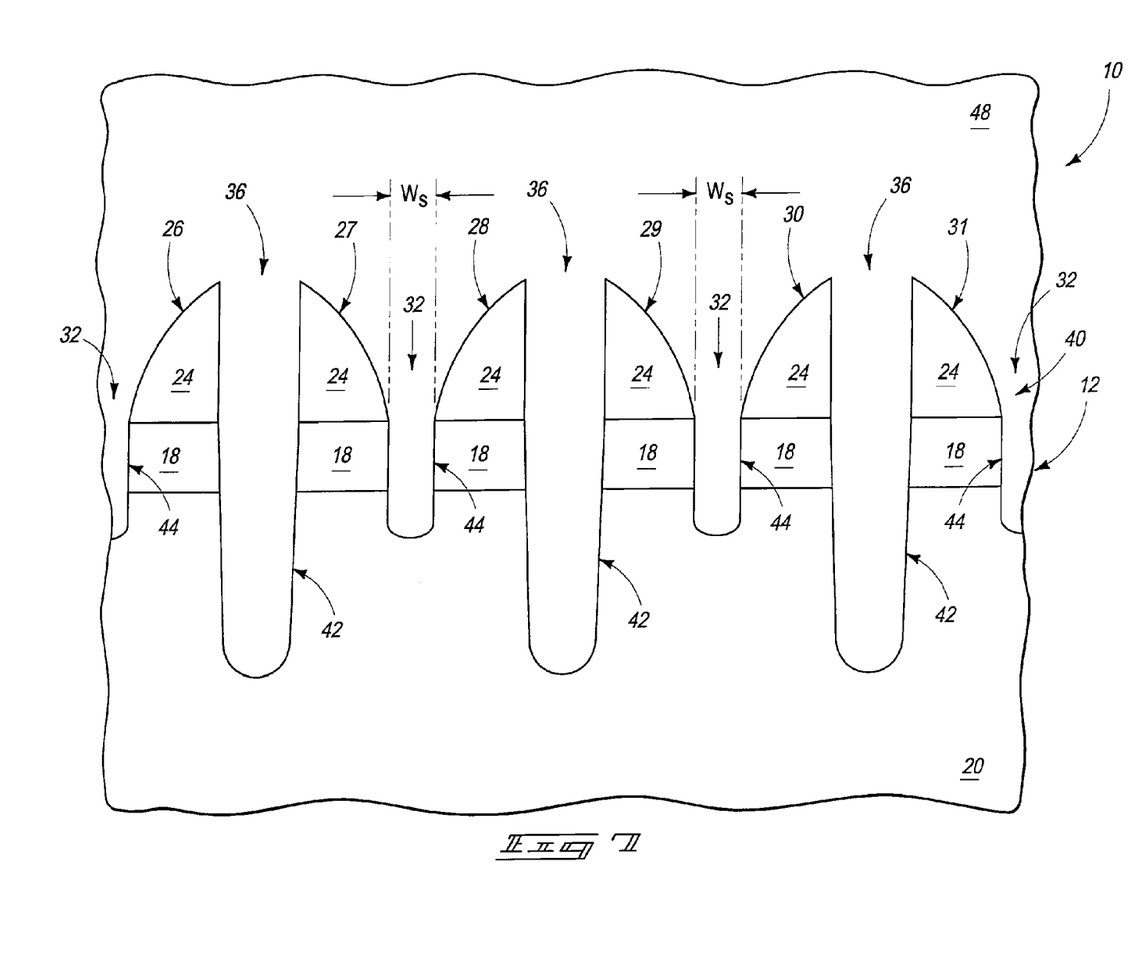
FIG. 7 is a view of the FIG. 6 substrate at a processing step subsequent to that shown by FIG. 6.

Referring to an example in FIG. 7, one or more dielectric materials 48 has been deposited at the same time to within both inter-transistor trenches 42 and intra-transistor trenches 44. In such example, such depositing has been continued until both such trenches have been overfilled with dielectric material 48. Inter-transistor trenches 42 and intra-transistor trenches 44 may additionally be lined with a dielectric or other material, for example by thermal growth, prior to deposition of dielectric material 48. Example materials 48 include doped silicon dioxide, undoped silicon dioxide, and/or silicon nitride.

Figure 8:
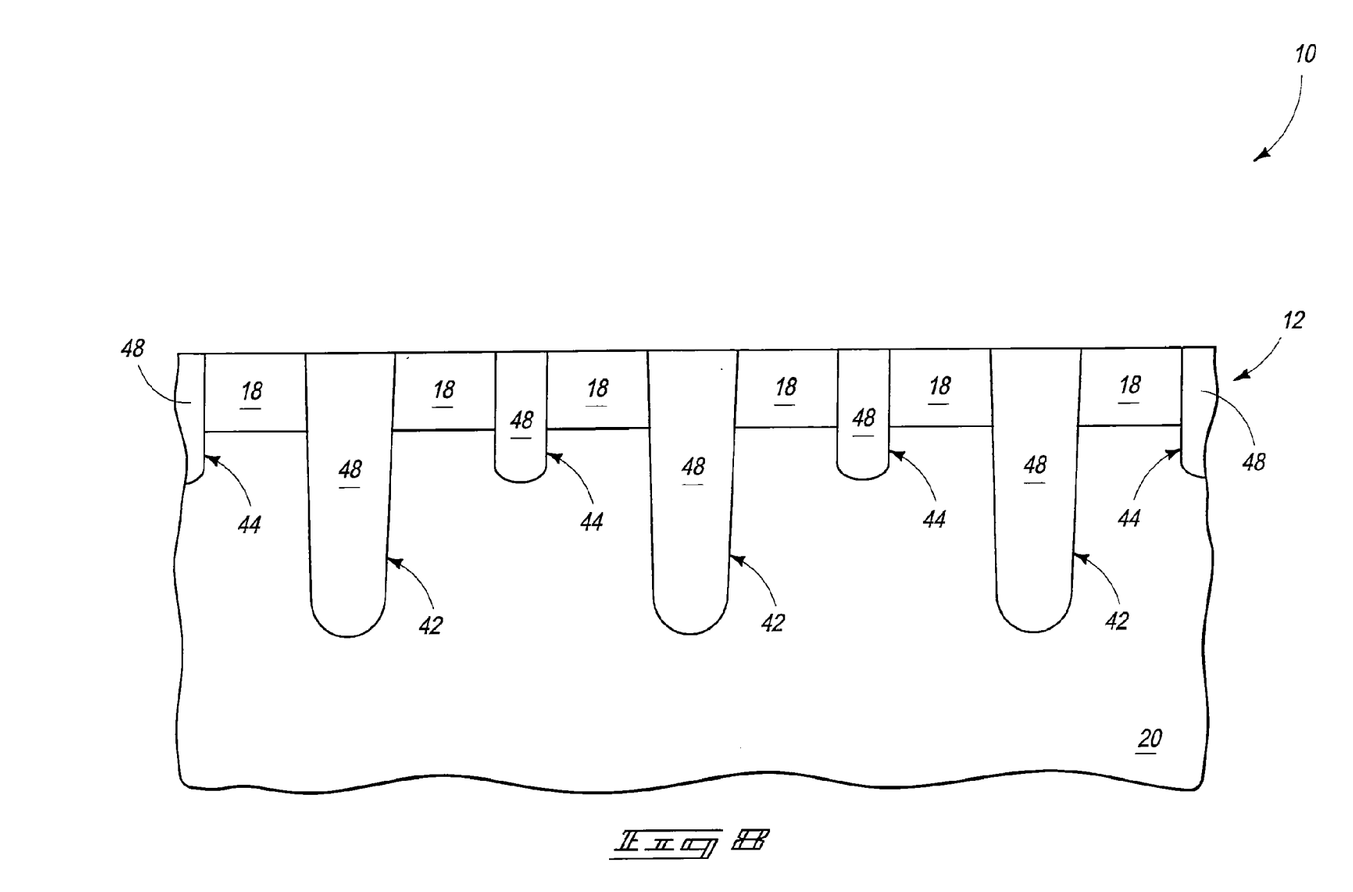
FIG. 8 is a view of the FIG. 7 substrate at a processing step subsequent to that shown by FIG. 7.

Referring to FIG. 8, dielectric material 48 as been planarized back at least to the outermost surface of semiconductive material 12, and thereby spacers 26-31 (not shown) have been removed. Spacers 26-31 might alternately be totally removed prior to deposition of dielectric material 48, or might partially or wholly remain as part of the finished integrated-circuit construction.

U.S. Patent Application Publication No. 2009/0206443 to Werner Juengling, published on Aug. 20, 2009, is hereby fully incorporated by reference as if included in its entirety herein. The production processing to produce the construction of FIG. 2 in the 2009/0206443 publication etched the two different depth sets of trenches at different times and used two different dielectric deposition steps to fill such trenches with dielectric material 108 and 110. In accordance with this disclosure, processing as described above enables, although not necessarily requires, the different depth trenches to be etched and filled at the same respective times.

Figure 9:
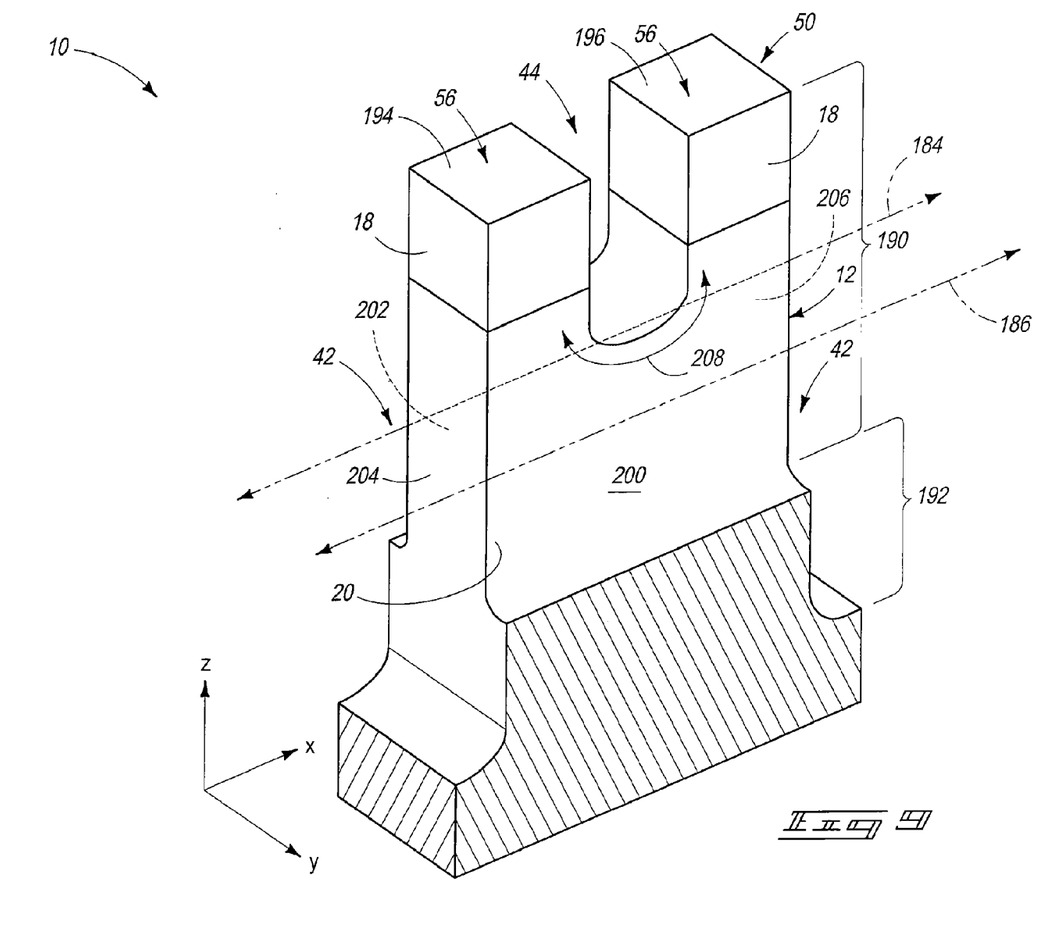
FIG. 9 is an enlarged diagrammatic perspective view of a portion of the FIG. 8 substrate with certain dielectric material having been removed for clarity.

Processing may proceed as described in the 2009/0206443 publication in the fabrication of a plurality of field effect transistors, or in additional or other manners for fabrication of a plurality of field effect transistors. For example, processing may proceed as described with respect to FIGS. 3-27 in the 2009/0206443 publication to produce a plurality of field effect transistors, one of which is indicated with reference numeral 50 in FIG. 9 herein. FIG. 9 illustrates an example semiconductive material shape of the semiconductive portion of a single transistor 50, for example the result of processing conducted in association with FIGS. 3-26 in the 2009/0206443 publication. In FIG. 9 herein, isolation material 48 (not shown) within inter-transistor trenches 42 and intra-transistor trench 44 has been removed for clarity. Transistor 50 includes a fin 190 rising from a base 192. Fin 190 includes a distal portion with two legs 194 and 196 separated by an intra-transistor trench 44 which extends below the depth of upper-doped region 18. Illustrated legs 194 and 196 include both upper-doped region 18 and a top portion of lower-doped region 20. Fin 190 also includes two opposing sides 200 and 202 that may be generally parallel to one another, generally angled with respect to one another, or generally curved with respect to one another. Edges 204 and 206 of fin 190 are also shown, and which may be generally perpendicular to sides 200 and 202 and generally parallel to one another, generally angled with respect to one another, or generally curved with respect to one another.

Upper-doped regions 18 constitute a pair of source/drain regions 56 which have been formed within semiconductive material 12 on opposing sides of individual of the intra-transistor trench 44 between immediately adjacent of the inter-transistor trenches 42. A channel region 208 may be provided within semiconductive material 12 elevationally inward of the pair of source/drain regions 56 between immediately adjacent of inter-transistor trenches 42. A gate is provided operable proximate such channel region. Such is diagrammatically shown in FIG. 9 as constituting a pair of gates 184 and 186 received laterally over the respective two opposing sides 202 and 200, respectively. In one embodiment, either of gates 184 and 186 for transistor 50 comprises a portion of one of a plurality of gate lines which extend orthogonally relative to inter-transistor trenches 42. Transistor 50 may selectively control the flow of current between the source/drains 56 according to a voltage of gates 184 and 186. When turned on, transistor 50 establishes a channel represented by arrow 208 illustrating current flow between the two source/drains. The channel 208 may be established by electric fields emanating from gates 184 and 186. Gates 184 and 186 may be energized according to a variety of patterns, for example as described in the 2009/0206443 publication.

FIG. 9 in the description above was with respect to but one example embodiment of a transistor and method of establishing a channel region by use of one or more gates. Alternate constructions and methods are contemplated. For example, and by way of example only, a gate dielectric and gate may be provided within intra-transistor trenches 44, for example as shown in FIG. 33 of U.S. Patent Application Publication No. 2006/0046407.

Figure 10:
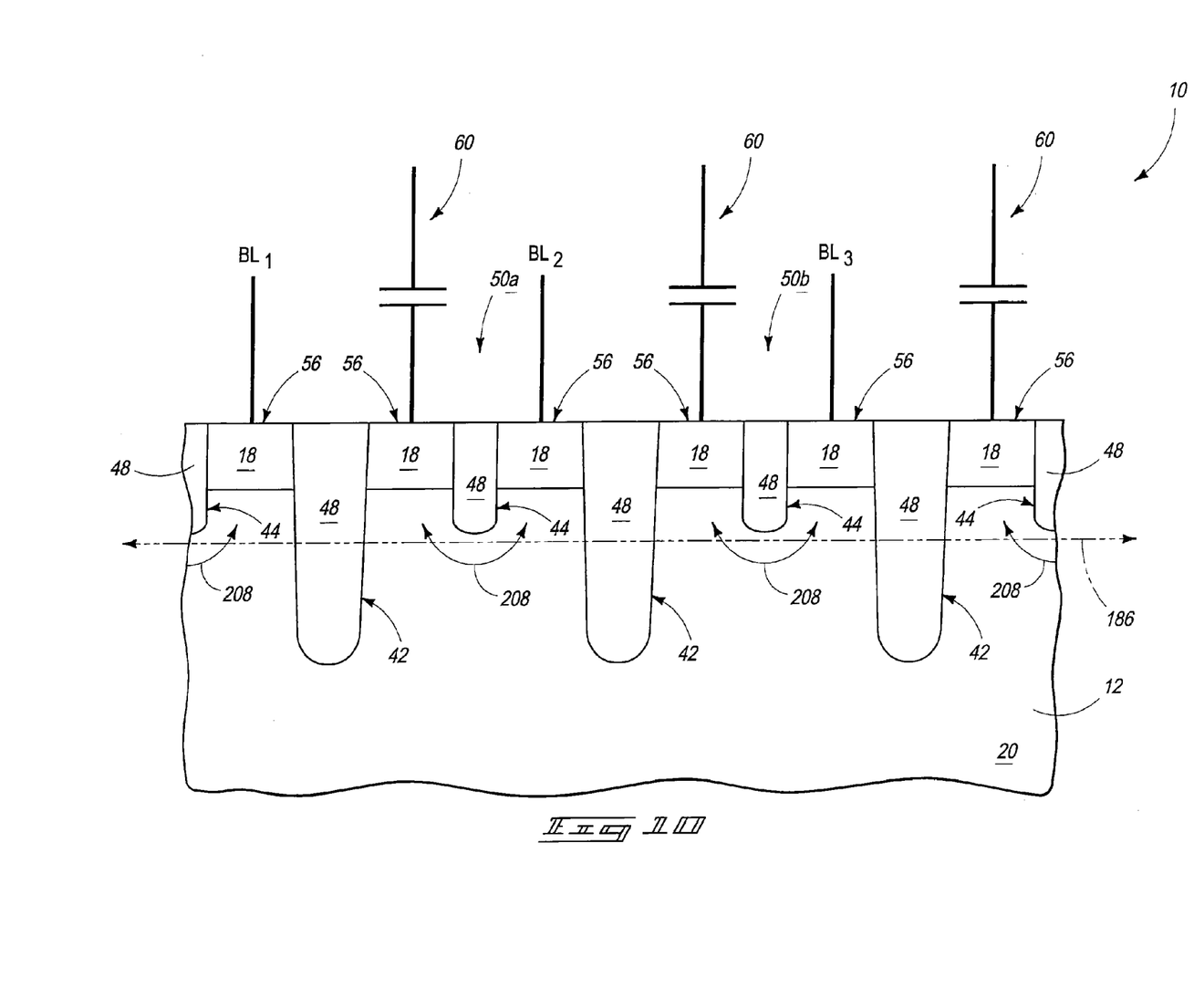
FIG. 10 is a view of the FIG. 8 substrate at a processing step subsequent to that shown by FIG. 8.

In one embodiment of a method of forming an array of memory cells, a plurality of word lines, a plurality of bit lines, and a plurality of charge storage devices are formed. For example, and referring to FIG. 10, two field effect transistors 50a and 50b are shown with each being connected with a charge storage device and with a bit line. In FIG. 10, charge storage devices 60 in the form of capacitors are schematically depicted as are bit lines $BL_1$, $BL_2$, $BL_3$. Individual of charge storage devices 60 are in electrical contact with one of the pair of source/drain regions 56 of an individual transistor. Further, one of the depicted bit lines $BL_1$, $BL_2$, $BL_3$ is in electrical contact with the other of the pair of source/drain regions 56 of the individual transistor. At least one word line, for example word line 186, is received operably proximate channel region 208 of the individual transistor. Each transistor in combination with its word line, the connected bit line, and the connected charge storage device constitutes a single memory cell.

Figure 11:
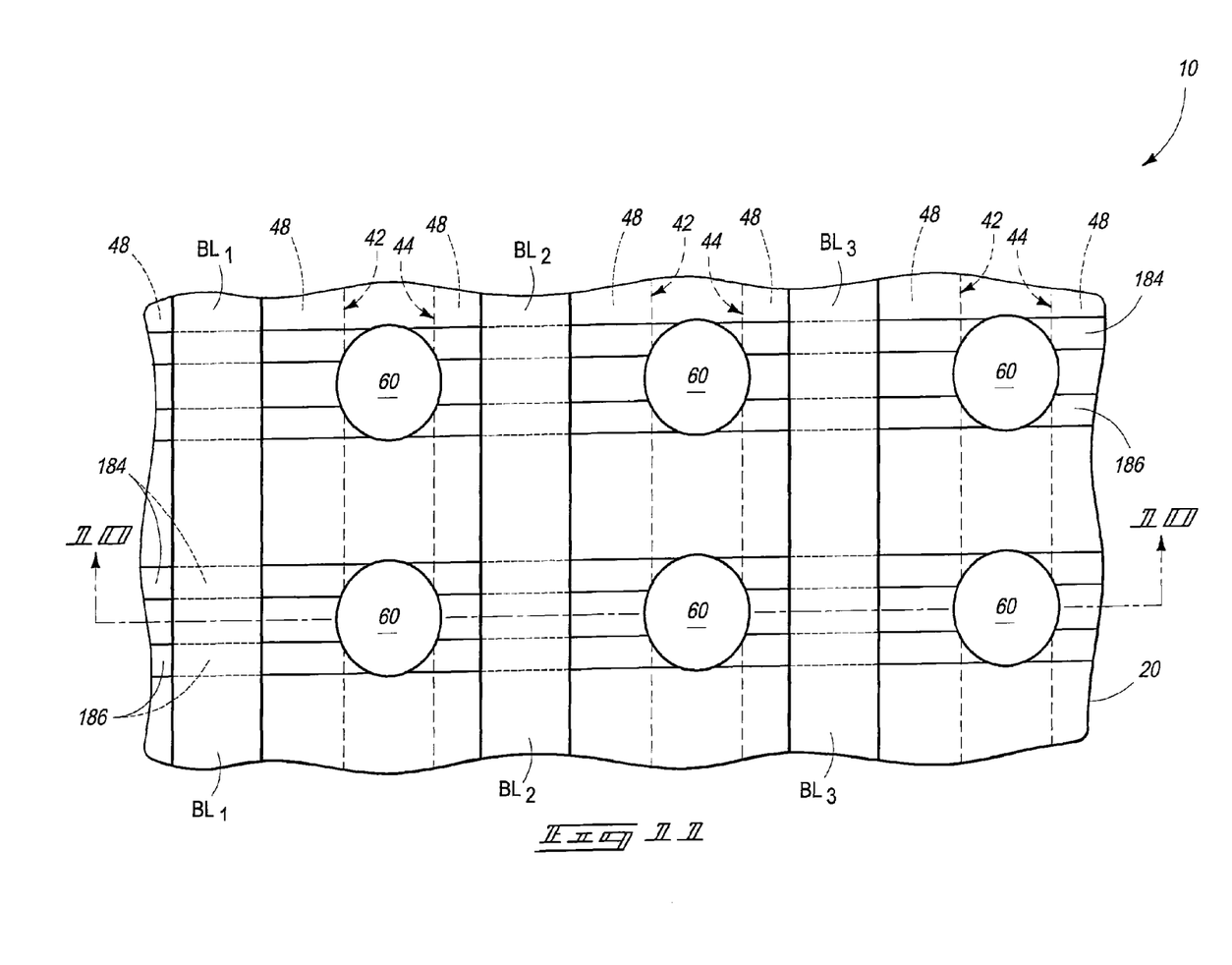
FIG. 11 is a diagrammatic top plan view of the substrate fragment of FIG. 10, with FIG. 10 having been taken through line 10-10 in FIG. 11.

FIG. 11 diagrammatically depicts a top view of the FIG. 10 schematic.

Figure 12:
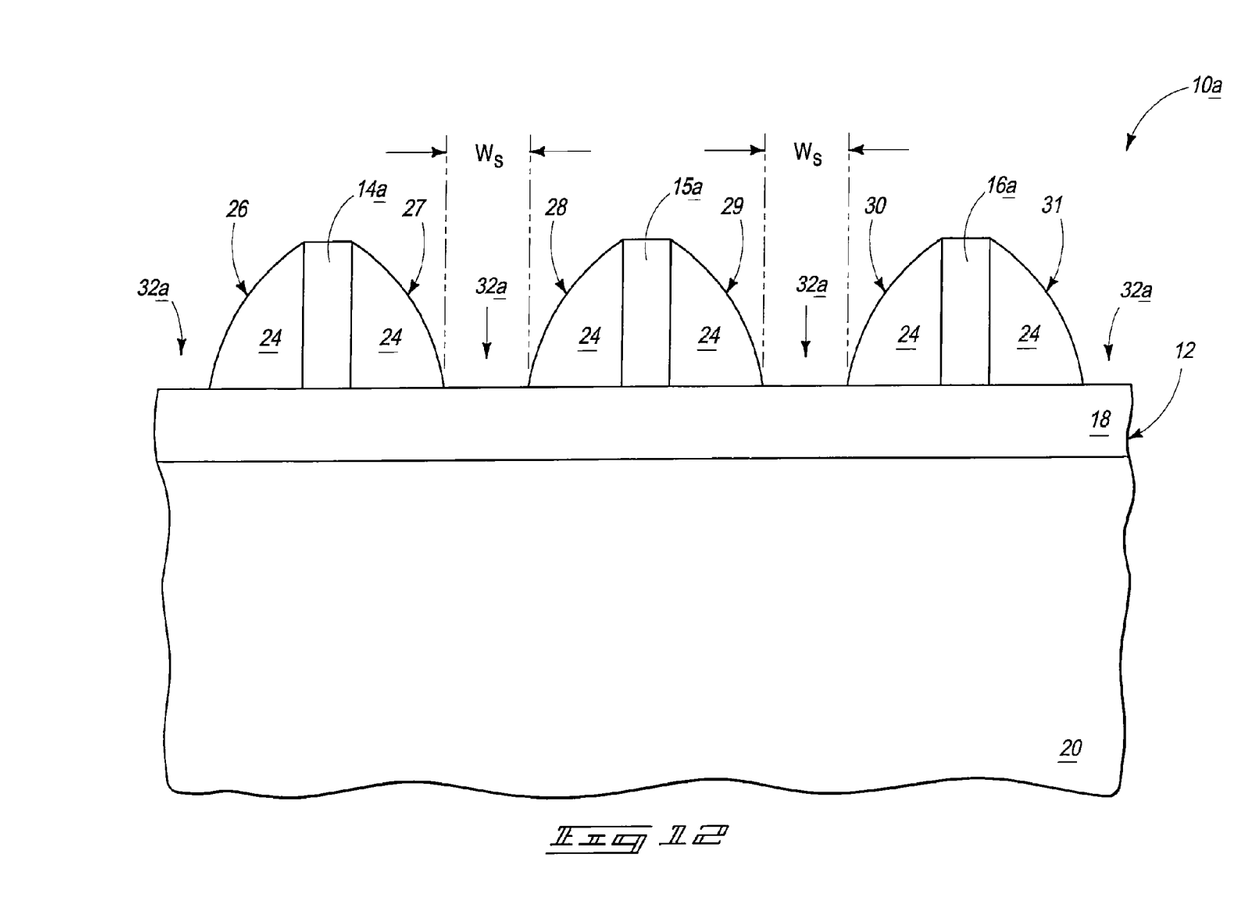
FIG. 12 is a diagrammatic sectional view of a substrate fragment in process in accordance with an embodiment of the invention.
Figure 13:
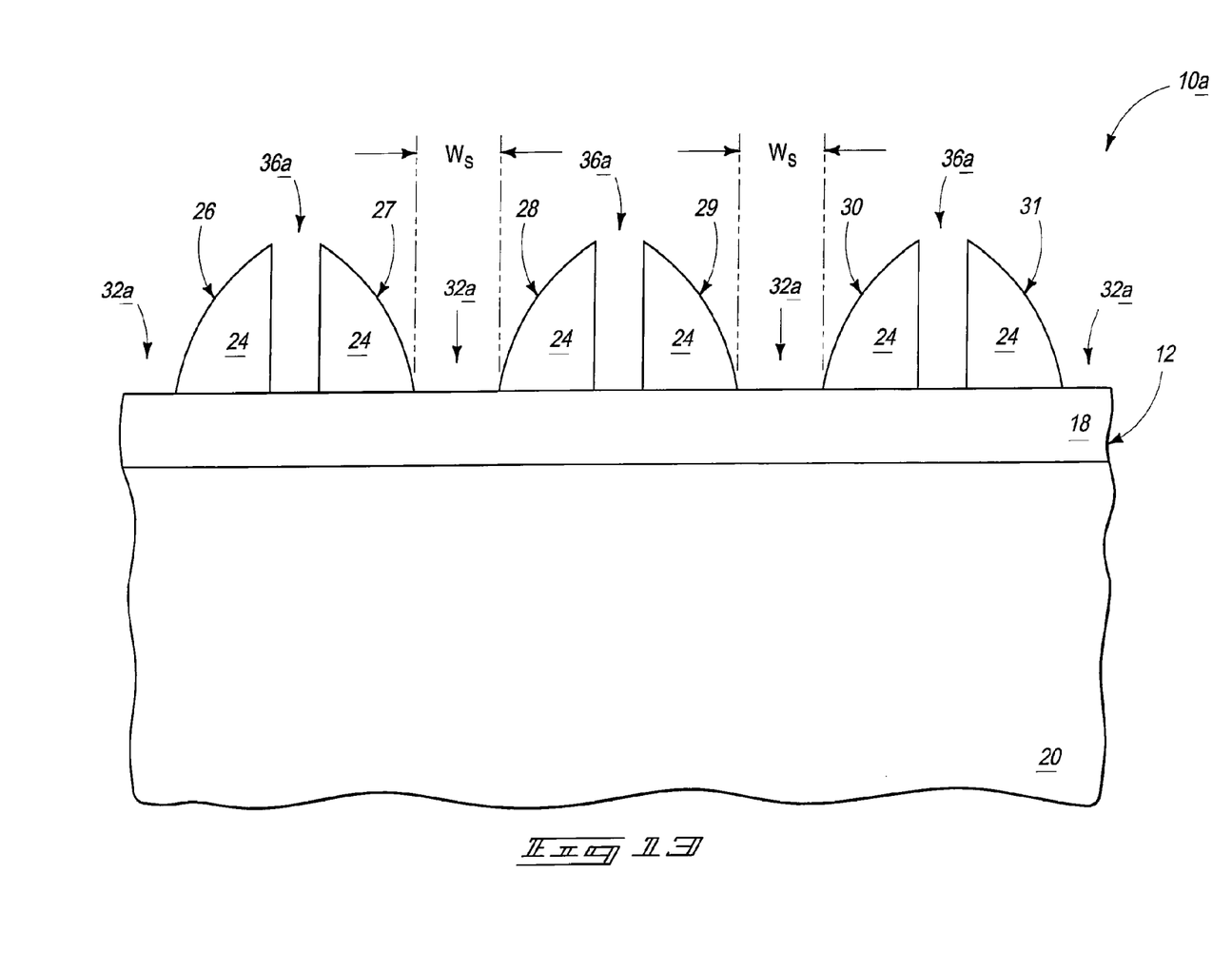
FIG. 13 is a view of the FIG. 12 substrate at a processing step subsequent to that shown by FIG. 12.
Figure 14:
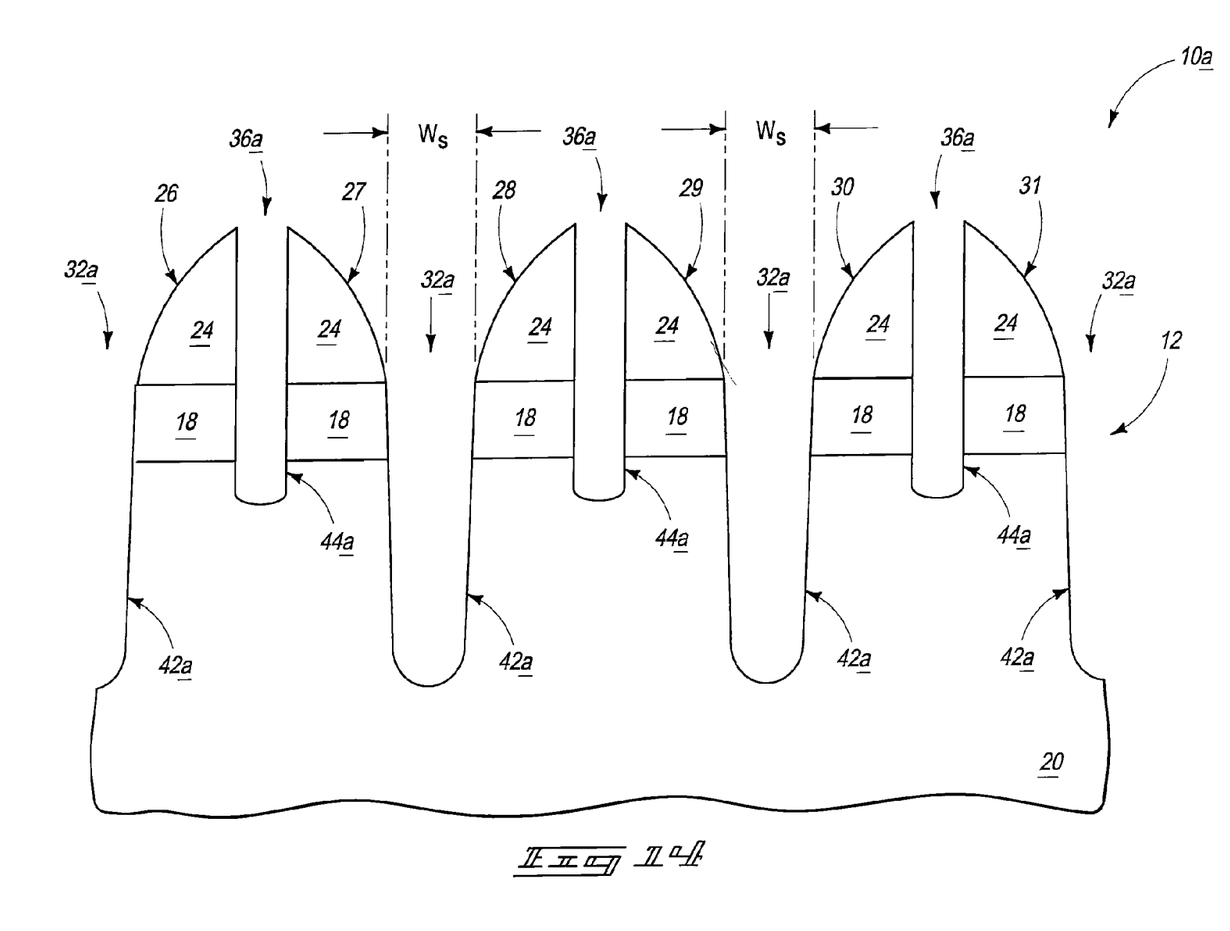
FIG. 14 is a view of the FIG. 13 substrate at a processing step subsequent to that shown by FIG. 13.

In the above embodiment of FIG. 4, lines 14, 15, 16 individually had greater maximum width than minimum width of spaces 32 between immediately adjacent of the spacers between immediately adjacent of the lines in the depicted cross section. However, such may be reversed wherein the lines individually have lesser maximum width than minimum width of a space between immediately adjacent of the spacers between immediately adjacent of the lines. For example, FIG. 12 discloses an alternate embodiment substrate fragment 10a to that depicted by FIG. 4 wherein such width relationships have been reversed. Like numerals from the FIG. 4 embodiment have been utilized in FIG. 12, with differences being indicated with the suffix "a". Subsequent processing may occur analogously to FIGS. 5-11 in forming a plurality of field effect transistors, including a method of forming an array of memory cells which individually comprise a field effect transistor and a charge storage device. In such embodiments, the wider spaces 32a may be used for the inter-transistor trenches and the spaces 36a left after removing lines 14a, 15a, and 16a (FIG. 13) may be used for the intra-transistor trenches. For example, FIG. 14 shows inter-transistor trenches 42a and intra-transistor trenches 44a. Other arrays of memory cells may also be fabricated using any of the above techniques.

Some embodiments of the invention encompass methods of forming source/drain regions of field effect transistors and isolation trenches within semiconductive material of a semiconductor substrate independent of subsequent fabrication of a channel region and a gate. For example in one embodiment, such a method comprises forming a pair of first mask openings and a second mask opening in a mask received over semiconductive material of a semiconductor substrate. The pair of first mask openings are wider than the second mask opening. The second mask opening is received between the pair of first mask openings, and in one embodiment is centered between the pair of first mask openings. For example with respect to FIG. 5, the two far left-illustrated mask openings 36 may be considered as an example such pair of first mask openings, and the second mask opening 32 received there-between may be considered as such second mask opening in a mask 40.

Using such mask, both a pair of isolation trenches and an intra-transistor trench are etched into the semiconductive material. The isolation trenches are formed through the first mask openings while the intra-transistor trench is formed through the second mask opening. The isolation trenches are etched wider and deeper within the semiconductive material than is the intra-transistor trench. Such processing is depicted, for example, in FIG. 6. A pair of source/drain regions is provided within semiconductive material on opposing sides of the intra-transistor trench between the pair of isolation trenches.

Embodiments of the invention also encompass methods of forming a series of spaced trenches into a substrate independent of whether a plurality of field effect transistors are formed, and independent of forming source/drain regions. Example embodiments of such a method encompass forming a plurality of spaced lines over a substrate which may or may not be a semiconductor substrate. Anisotropically etched sidewall spacers are formed on opposing sides of the spaced lines. In one embodiment, individual of the lines have greater maximum width than minimum width of space between immediately adjacent of the spacers between immediately adjacent of the lines. Alternately, individual of the lines have lesser minimum width than minimum width of space between immediately adjacent of the spacers between immediately adjacent of the lines. The former is shown by example in FIG. 4 while the latter is shown by example in FIG. 12.

The spaced lines are removed to form a series of alternating first and second mask openings between the spacers. The first mask openings are located where the spaced lines were previously located. In one embodiment (i.e., that of FIG. 5), the first mask openings are wider than the second mask openings. In another embodiment (i.e., that of FIG. 13), the first mask openings are narrower than the second mask openings.

Alternating first and second trenches are simultaneously etched into the substrate through the alternating first and second mask openings, respectively, to form first and second trenches within the substrate. In one embodiment (i.e., that of FIG. 6), the first trenches are formed to be wider and deeper within the substrate than are the second trenches. In another embodiment (i.e., that of FIG. 14), the first trenches are formed to be narrower and shallower within the substrate than are the second trenches.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a series of spaced trenches into a substrate, comprising:
   forming a plurality of spaced lines over a substrate;
   forming anisotropically etched sidewall spacers on opposing sides of the spaced lines, individual of the lines having greater maximum width than minimum width of space between immediately adjacent of the spacers between immediately adjacent of the lines;
   removing the spaced lines to form a series of alternating first and second mask openings between the spacers, the first mask openings being located where the spaced lines were located and being wider than the second mask openings, the respective first openings having laterally innermost edges defined by laterally innermost edges of the spacers, the respective second openings having laterally innermost edges defined by laterally outermost edges of the spacers; and
   simultaneously etching alternating first and second trenches into the substrate through the alternating first and second mask openings, respectively, to form the first trenches to be wider and deeper within the substrate than are the second trenches.

2. The method of claim 1 wherein forming the spaced lines comprises:
   forming precursor lines individually having width greater than said maximum width; and
   laterally trimming the width of the precursor lines.

3. The method of claim 2 wherein the laterally trimming is by etching to said maximum width.

4. The method of claim 3 comprising forming the precursor lines to comprise photoresist.

5. The method of claim 1 wherein the removing forms the first mask openings to be at least 1.5 times wider than the second mask openings.

6. The method of claim 1 wherein the removing forms the first mask openings to be at least 1.75 times wider than the second mask openings.

7. The method of claim 1 wherein the etching comprises plasma etching.

8. The method of claim 1 wherein the substrate comprises semiconductive material, the etching forming the first trenches to be about twice as deep within the semiconductive material as the second trenches.

9. The method of claim 1 comprising filling the first trenches with dielectric material.

10. The method of claim 1 comprising filling the second trenches with dielectric material.

11. The method of claim 1 comprising filling both the first and second trenches with dielectric material.

12. The method of claim 11 wherein the filling comprises depositing the same dielectric material at the same time to within both the first and second trenches.

13. The method of claim 12 comprising continuing the depositing until both the first and second trenches have been overfilled with said same dielectric material.

* * * * *